(12) United States Patent
Lin et al.

(10) Patent No.: US 9,887,215 B2
(45) Date of Patent: Feb. 6, 2018

(54) DISPLAY MODULE MANUFACTURING METHOD AND DISPLAY MODULE

(71) Applicant: AU OPTRONICS CORPORATION, Hsin-Chu (TW)

(72) Inventors: Jia-Hua Lin, Hsin-Chu (TW); Chih-Hung Tsai, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/421,337

(22) Filed: Jan. 31, 2017

(65) Prior Publication Data

US 2017/0141136 A1 May 18, 2017

Related U.S. Application Data

(62) Division of application No. 14/823,127, filed on Aug. 11, 2015, now Pat. No. 9,596,732.

(30) Foreign Application Priority Data

Aug. 22, 2014 (TW) .............................. 103129045 A

(51) Int. Cl.
*H01L 27/12* (2006.01)
*H01L 21/00* (2006.01)
(Continued)

(52) U.S. Cl.
CPC ...... *H01L 27/1266* (2013.01); *H01L 27/1218* (2013.01); *G02F 1/1368* (2013.01);
(Continued)

(58) Field of Classification Search
None
See application file for complete search history.

(56) References Cited

U.S. PATENT DOCUMENTS 5,867,236 A * 2/1999 Babuka ................. G02F 1/1339
349/153
8,773,625 B2 * 7/2014 Li .......................... G02F 1/1333
349/122

(Continued)

FOREIGN PATENT DOCUMENTS

CN 1345010 A 4/2002
CN 102522420 A 6/2012
(Continued)

OTHER PUBLICATIONS

Office Action and Search Report issued in corresponding China patent application dated May 4, 2016.
(Continued)

*Primary Examiner* — Shamim Ahmed
(74) *Attorney, Agent, or Firm* — McClure, Qualey & Rodack, LLP

(57) ABSTRACT

A display module substrate and a manufacturing method thereof are provided. The display module substrate includes a substrate body and a plurality of signal circuits. The substrate body has a supporting surface. The supporting surface includes a viewing area and a signal circuit area on one side of the viewing area. The signal circuits are disposed on the supporting surface and located at the signal circuit area. The signal circuit area has a plurality of apertures running through the substrate body, wherein the apertures are not shielded by the signal circuits. In a manufacturing thereof, the substrate body is disposed on a transparent carrier plate. When high-energy light is applied through the transparent carrier plate to etch a bottom surface of the substrate body to separate the substrate body and the transparent carrier plate, the resulting gas leaves through the apertures.

7 Claims, 5 Drawing Sheets

(51) Int. Cl.
  *H01L 51/00* (2006.01)
  *G02F 1/1368* (2006.01)
  *G02F 1/1335* (2006.01)
  *G02F 1/1333* (2006.01)

(52) U.S. Cl.
  CPC .. *G02F 1/133305* (2013.01); *G02F 1/133514* (2013.01); *H01L 51/003* (2013.01); *H01L 51/0097* (2013.01); *H01L 2227/326* (2013.01); *H01L 2251/5338* (2013.01)

(56) References Cited

U.S. PATENT DOCUMENTS

| | | | | |
|---|---|---|---|---|
| 2012/0164408 A1* | 6/2012 | Hwu | ............... | B32B 7/06 428/202 |
| 2014/0003022 A1 | 1/2014 | Lee | | |
| 2014/0147577 A1* | 5/2014 | Lee | ............... | H01L 51/56 427/8 |
| 2014/0346519 A1 | 11/2014 | Ke et al. | | |
| 2015/0160523 A1* | 6/2015 | Fukami | ............ | G02F 1/136286 349/47 |
| 2015/0214503 A1 | 7/2015 | Ke et al. | | |

FOREIGN PATENT DOCUMENTS

| TW | I365518 B | 6/2012 |
|---|---|---|
| TW | 201325904 | 7/2013 |

OTHER PUBLICATIONS

TW Office Action dated Sep. 26, 2016 in corresponding Taiwan application (No. 103129045).

* cited by examiner

DISPLAY MODULE MANUFACTURING METHOD AND DISPLAY MODULE

BACKGROUND OF THE INVENTION

1. Field of the Invention

The present invention generally relates to a manufacturing method of a substrate for display module. Particularly, the present invention relates to a manufacturing method of substrate for thin-type display module.

2. Description of the Prior Art

Display devices have been extensively applied to various electrical products including computer, television, and communication devices; in addition, the display devices are getting small, thin and light due to the advancement of industrial technology and the user demand. Apart from the usual plane-surface character, display panels nowadays further have curved or flexible feature and go with variable display device designs, or provided for display device development. The display device itself may namely be the major part and accompanied with functions such as word processing, communication and data processing.

With regard to the manufacture of flexible display panel/display device, it is generally to form or cut a flexible substrate first (wherein forming the flexible substrate includes coating on a glass plate without cutting), then to dispose circuits, illumination material and/or light sources on the substrate. However, the flexible substrate itself may not be suitable for the high-temperature manufacturing process; accordingly, inflexible sheet materials may be required to serve as a carrier of the flexible substrate. After the manufacturing process is completed, releasing of the flexible substrate from the carrier is conducted by high-energy laser. However, heat and gas which accompany high-energy laser in the releasing process may cause the deformation of the substrate that changes the pitch of the bonding pads in the fan-out area and raises the difficulty of the following processes.

SUMMARY OF THE INVENTION

It is an object of the present invention to provide a display module substrate which has less deformation.

It is another object of the present invention to provide a manufacturing method of a display module which alleviates the deformation of product and improves the yield of product.

The display module substrate of the present invention includes a substrate body and a plurality of signal circuits. The substrate has a supporting surface. The supporting surface includes a viewing area and a signal circuit area on one side of the viewing area. The signal circuits are disposed on the supporting surface and located at the signal circuit area. The signal circuit area has a plurality of apertures running through the substrate body, wherein the apertures are not shielded by the signal circuits.

The manufacturing method of the display module substrate of the present invention includes (a) disposing a substrate body on a transparent carrier plate; wherein the substrate body has a bottom surface and a supporting surface opposite to the bottom surface, the bottom surface is attached to the transparent carrier plate, the supporting surface includes a viewing area and a signal circuit area; (b) disposing a plurality of signal circuits in the signal circuit area; (c) forming a plurality of apertures in the signal circuit area, the apertures running through the substrate body and not shielded by the signal circuits; (d) etching the bottom surface by high-energy light through the transparent carrier plate to separate the substrate body from the transparent carrier plate.

DETAILED DESCRIPTION OF THE PREFERRED EMBODIMENT

Figure 1:
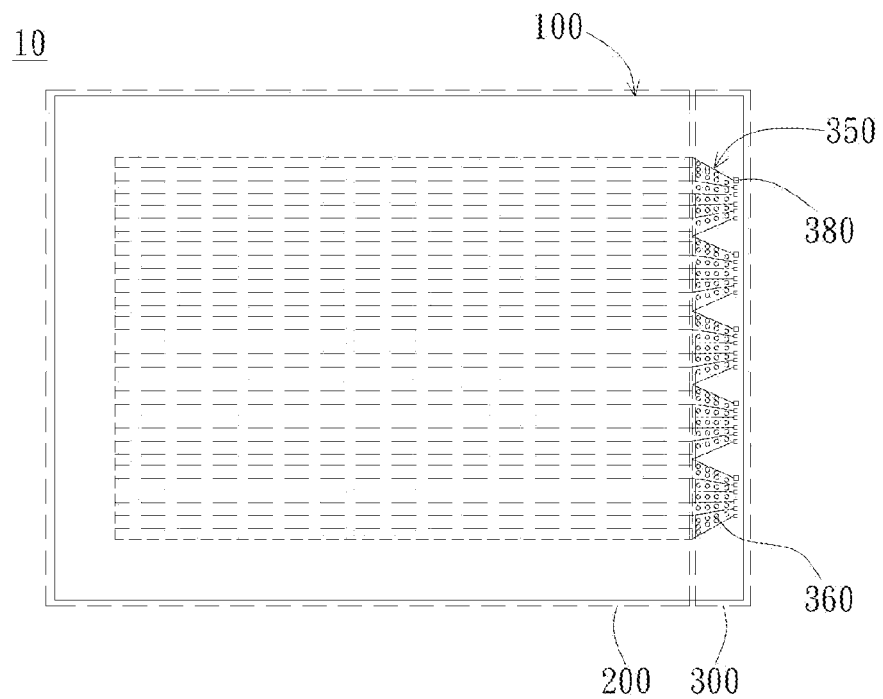
FIG. 1 shows a top view of an embodiment of the display module substrate of the present invention.
Figure 2:
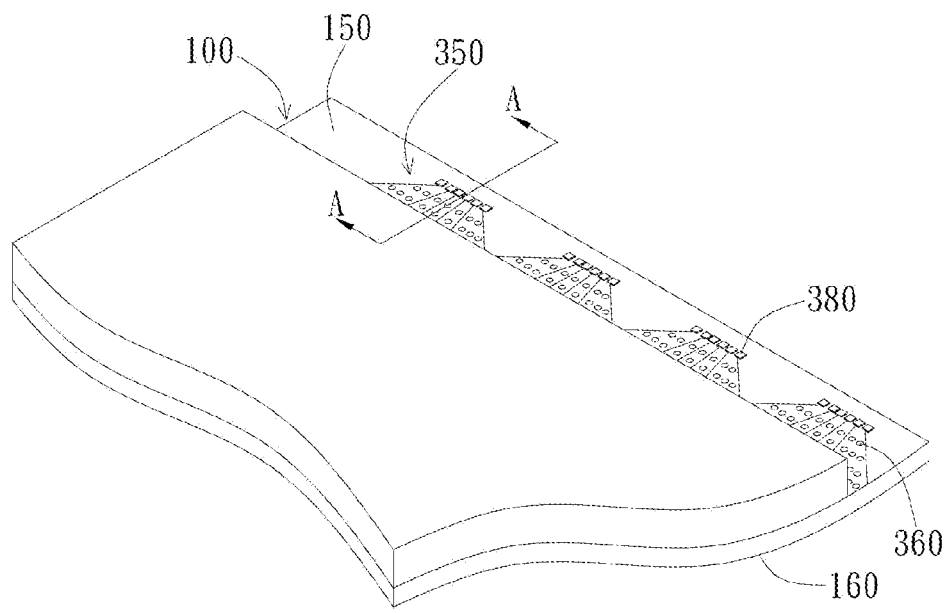
FIG. 2 is a partial three-dimensional view of the embodiment of FIG. 1.

As shown in FIGS. 1-2, the display module substrate of the present invention includes a substrate body 100 and a plurality of signal circuits 350. The substrate body 100 has a supporting surface 150; the signal circuits 350 are disposed on the supporting surface 150. On the other hand, the substrate body 100 has a bottom surface 160 opposite to the supporting surface 150. In detail, the substrate body 100 may be a plastic material and preferably flexible. In a preferred embodiment, the substrate body 100 may be in the form of plastic thin film. Material for the substrate body can be, for example, polyimide (PI). In addition, the display module substrate 10 may be, for example, the substrate for LCD (Liquid Crystal Device) display module, the substrate of OLED (Organic Light-Emitting Diode), but not limited thereto.

The supporting surface 150 of the substrate body 100 includes a viewing area 200 and a signal circuit area 300, wherein at least a portion of the signal circuit area 300 may be a fan-out area and/or an IC (integrated circuit) bonding area. IC(s) may be disposed on the fan-out area by means of such as COG (chip on glass), COF (chip on film) and others. The plurality of signal circuits 350 is disposed on the signal circuit area 300. Preferably, the plurality of signal circuits 350 crowd together on the signal circuit area 300 and form at least a crowd. Take the embodiments shown in FIGS. 1-2 for example; the plurality of signal circuits 350 forms five crowds on the signal circuit area 300 and the signal circuits 350 in each crowd are distributed according to a specific pattern. For example, multiple signal circuits 350 in the crowd extend and simultaneously converge toward the pads 380 to constitute a signal crowd in the shape of trapezoid-like or fan-like.

The signal circuit area 300 may be on one side of the viewing area 200 and usually distributed along the side of the viewing area 200. In other embodiments, the viewing area 200 may have more than one side with the signal circuit area 300 distributed.

The viewing area 200 of the supporting surface 150 may further include electrodes and/or driving elements such as TFT (Thin-Film Transistor), liquid crystals, illumination material and/or color filter. The signal circuits 350 on the signal circuit area 300 may be electrically connected to the electrodes and/or driving elements; in addition, a driving circuit of the display module such as IC driver may be connected to the signal circuits 350 on the signal circuit area 300 of the substrate body 100.

Figure 3:
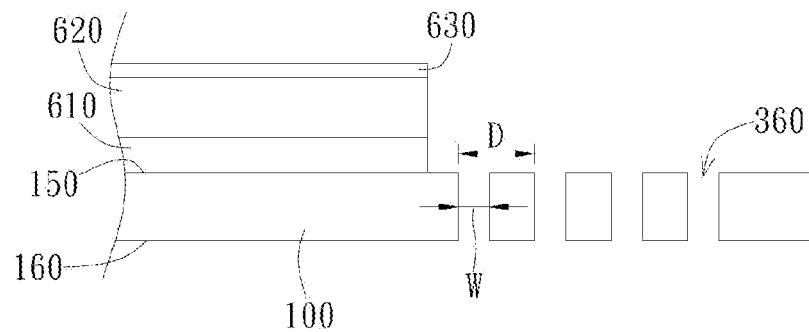
FIG. 3 is a cross-sectional view of the embodiment of FIG. 2 along the AA line.
Figure 4:
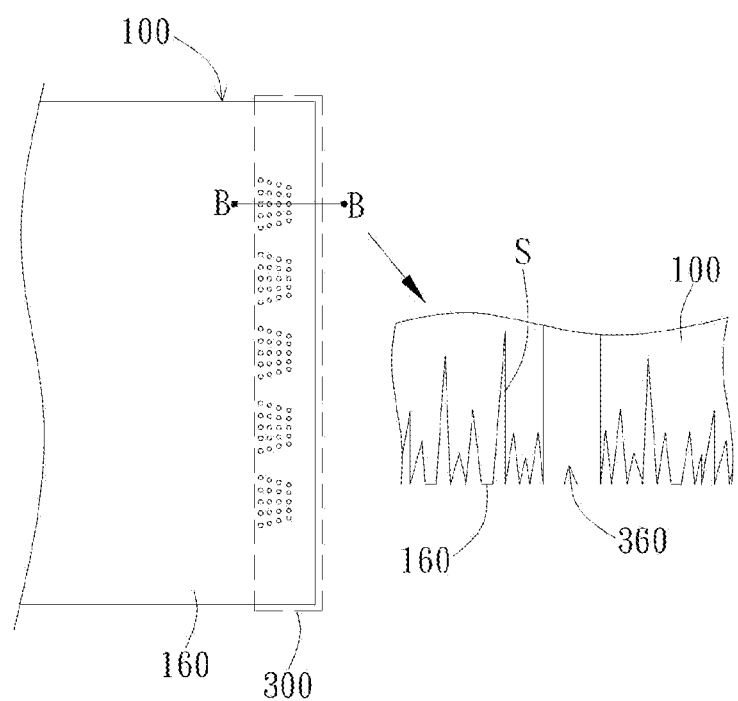
FIG. 4 shows a bottom view of the embodiment of the display module substrate of the present invention.

As shown in FIGS. 3-4, the signal circuit area 300 further has a plurality of apertures 360 running through the substrate body 100. In other words, openings of the apertures 360 are on the supporting surface 150 and the bottom surface 160, wherein depth of the apertures is preferably 5-100 micrometers and is substantially equal to the thickness of the substrate body 100. Multiple apertures 360 which preferably have a diameter W of not less than 1 micrometer may be formed on the substrate body 100 by means of drilling approaches, such as laser cutting and punching, wherein a distance D between the adjacent apertures 360 are preferably not less than 1 micrometer (in FIG. 3, the distance D is shown from the left end of one aperture to the left end of the adjacent aperture; alternatively, the distance D can be shown between the centerlines of the adjacent apertures). On the other hand, the apertures 360 are not shielded by the signal circuits 350 on the signal circuit area 300; for example, the apertures 360 are formed between the adjacent signal circuits 350. In the embodiment of the present invention, at least a portion of the apertures 360 are located between the adjacent signal circuits 350. When the plurality of signal circuits 350 in the signal circuit area 300 form the crowds such as the signal crowd in the shape of fan as mentioned above, the apertures 360 located in the crowds and between the adjacent signal circuits 350 may be distributed in the shape of fan.

As mentioned above, the substrate body 100 has the bottom surface 160 opposite to the supporting surface 150. Preferably, notches S are formed on the bottom surface 160. The notches S may be resulted from high-energy light etching such as laser etching. Further, the notches S are preferably distributed on a portion of the bottom surface 160 that corresponds to the signal circuit area 300 on the opposite supporting surface 150. The apertures 360 runs through the substrate body 100 and have openings on the supporting surface 150 and the bottom surface 160; the openings of the apertures 360 are further in the signal circuit area 300 of the supporting surface 150 and the portion of the bottom surface 160, wherein the portion of the bottom surface 160 corresponds to the signal circuit area 300, i.e. a portion of the supporting surface 150 which is just opposite to the portion of the bottom surface 160 has the signal circuit area 300. The openings of the apertures 360 on the bottom surface 160 area are surrounded by the notches S.

In the preferred embodiment of the present invention, the apertures 360 and the notches S may be resulted from the formation of the display module substrate 10 or remained therefrom. Further, the apertures 360 are the structures which the display module substrate 10 needs in a releasing process, wherein the apertures 360 may serve as passages for gas exhausting. The notches S are traces resulted from the releasing process carried out by laser. The manufacturing method of the display module substrate 10 are further described as followings.

Figure 5:
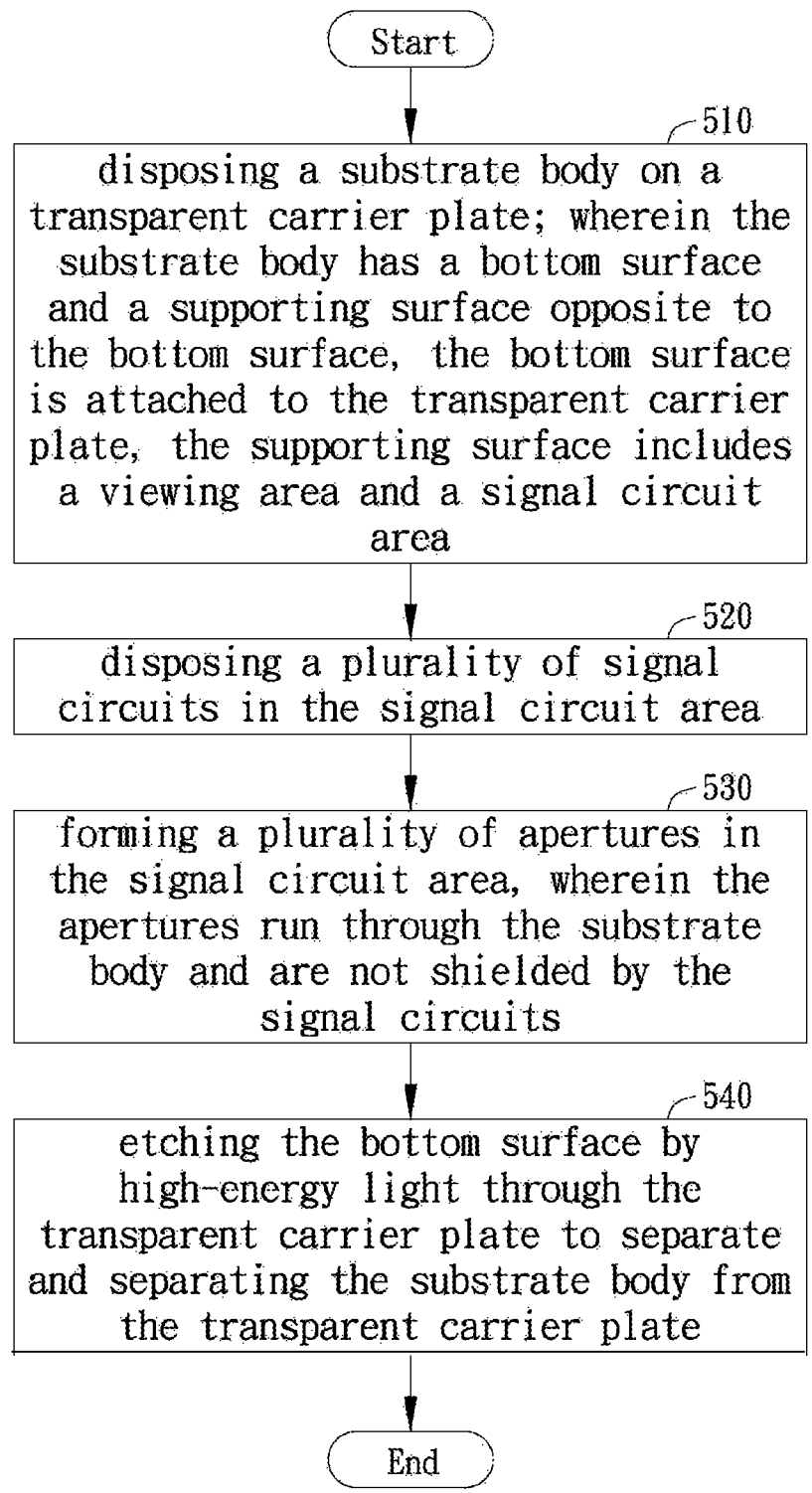
FIG. 5 shows a flow chart of the manufacturing process of display module substrate of the present invention.

As the embodiment shown in FIG. 5, the manufacturing method of the display module substrate 10 of the present invention may include step 510 of disposing a substrate body on a transparent carrier plate, wherein the substrate body has a bottom surface and a supporting surface opposite to the bottom surface. The bottom surface is attached to the transparent carrier plate; the supporting surface includes a viewing area and a signal circuit area on one side of the viewing area.

Figure 6:
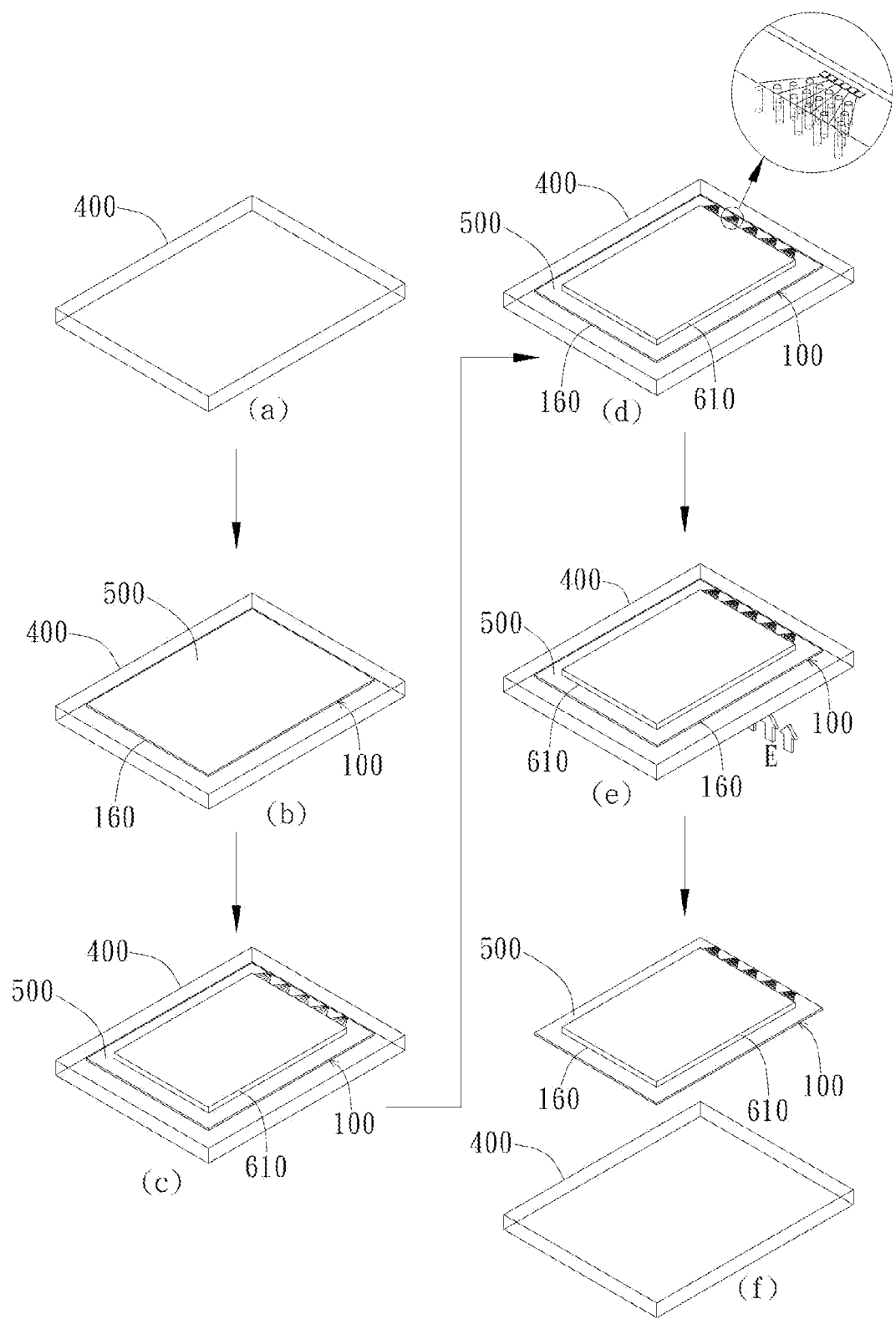
FIGS. 6-7 show schematic views of the manufacturing process of display module substrate of the present invention.

Since the substrate body 100 of the display module substrate 10 is flexible and usually has poor tolerance to high temperature, a carrier plate is provided to assist in the manufacture of the display module substrate. The carrier plate preferably has transparency and may be, for example, a glass plate. Light energy may be used during a releasing process. In addition, the substrate body 100 may be directly formed on the carrier plate, such as the transparent carrier plate 400 shown in FIG. 6. For example, material for the substrate body 100 may be coated on the transparent carrier plate 400 to form the substrate body 100.

The formed substrate body 100 has a bottom surface 160 and a face exposed outsides. As shown in FIG. 6(b), the bottom surface 160 is attached to the surface of the transparent carrier plate 400; the face exposed outsides will be the supporting surface 150. The supporting surface 150 is divided into several parts and at least into the viewing area 200 and the signal circuit area 300.

Figure 7:
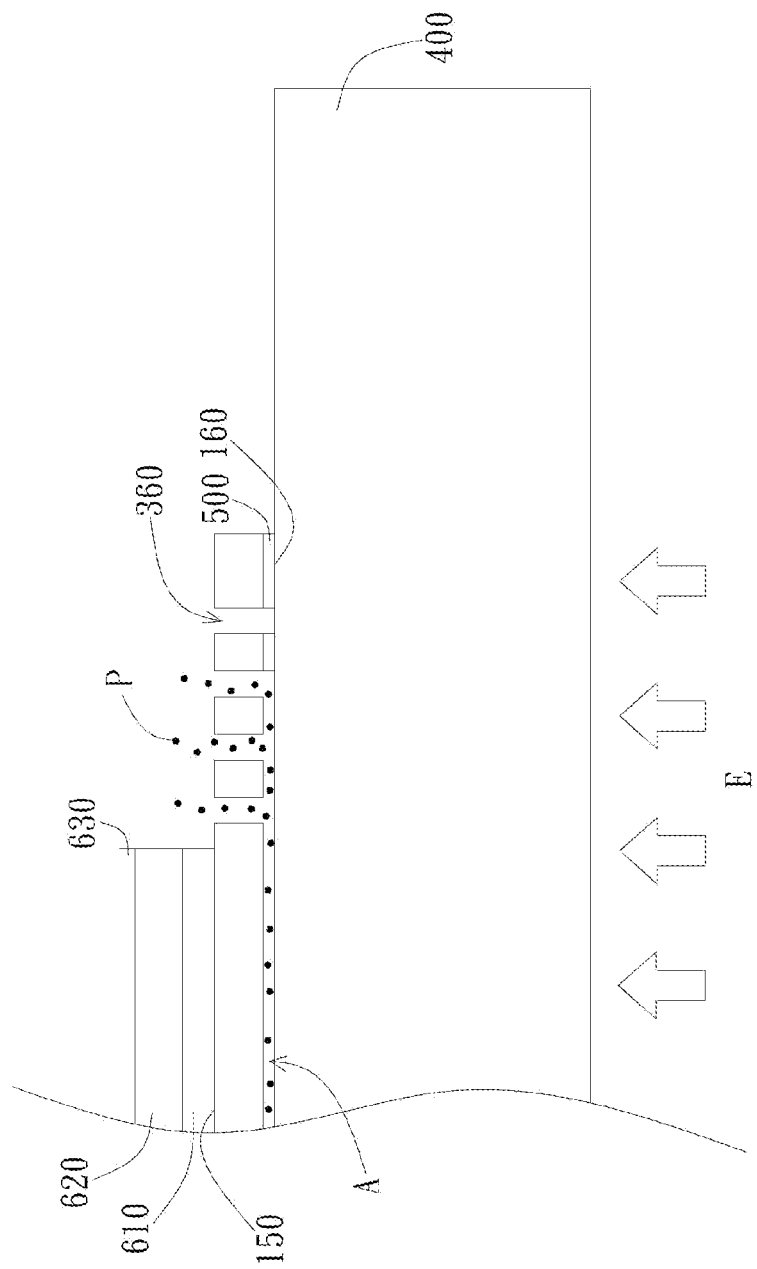

On the other hand, the step 510 preferably further includes disposing a sacrificial layer 500 or water-resistant layer on the transparent carrier plate (please refer to FIG. 7). The sacrificial layer may be formed directly on the transparent carrier plate; for example, a material such as an inorganic material for the sacrificial layer is coated on the substrate body to form the sacrificial layer. The sacrificial layer is formed between the substrate body and the transparent carrier plate; in other words, the substrate body is disposed on the sacrificial layer when the sacrificial layer is disposed on the transparent carrier plate. The sacrificial layer preferably has two opposite surfaces attached to the transparent carrier plate and the substrate body, respectively. The sacrificial layer may be an expendable to relieve loss of the substrate body during the releasing process.

The manufacturing method of the display module substrate 10 of the present invention further includes step 520 of disposing a plurality of signal circuits on the signal circuit area.

Preferably, the step 520 further includes disposing electrode(s) and/or driving element(s) on the supporting surface 150. In the preferred embodiment of the present invention, as shown in FIG. 6(c), TFT array 610 are formed on the supporting surface 150, wherein a plurality of signal circuits of the TFT array 610 are disposed on the signal circuit area 300. Preferably, the plurality of signal circuits 350 crowd together in the signal circuit area 300 to form at least one crowd. The plurality of signal circuits 350 in the at least one crowd are distributed specifically in shape. For example, multiple signal circuits 350 in the crowd extend and simultaneously converge toward the pads 380 to constitute a circuit crowd in the shape of trapezoid-like or fan-like.

In addition, the manufacturing method of the display module 10 of the present invention may further include disposing such as liquid crystals, illumination material, filter and/or film encapsulation. Take the embodiment shown in FIG. 3 for example. In the preferred embodiment of the present invention, organic illumination material is further disposed on the supporting surface 150, wherein an organic layer 620 is formed by such as vapor or liquid phase deposition and coating; it is preferred to from thin film encapsulation 630 outsides the organic layer 620. The display module substrate 10 manufactured in this way may serve as substrate for OLED.

The manufacturing method of the display module substrate 10 of the present invention further includes step 530 of forming a plurality of apertures in the signal circuit area, wherein the apertures run through the substrate body and are not shielded by the signal circuits. When the sacrificial layer is disposed between the substrate body and the transparent carrier plate, the apertures may further run through the sacrificial layer. Multiple apertures 360 which preferably have a diameter W of not less than 1 micrometer may be formed on the substrate body 100 by means of drilling approaches such as laser cutting and punching, wherein a distance D between the adjacent apertures 360 are preferably not less than 1 micrometer. Take the embodiment shown in FIG. 6 for example; the drilling starts from the side of the substrate body 100 opposite to the transparent carrier plate 400, i.e. the supporting surface 150. Further, the drilling is carried out in the signal circuit area 300 of the supporting surface 150 (alternatively, the drilling may be carried out from a bottom face of the glass plate) and keeps away from the signal circuits 350. The drilling preferably acts on an interface of the transparent carrier plate 400 and the substrate body 100 so as to ensure the formation of the apertures 360 running through the substrate body 100. The apertures 360 may be located at space between the adjacent signal circuits 350. When the plurality of signal circuits 350 crowd together in the signal circuit area 300 such as crowd together to form the signal crowd in the shape of fan-like, the apertures distributed therein may accordingly constitute the shape of fan.

The manufacturing method of the display module substrate 10 of the present invention further includes step 540 of etching the bottom surface by high-energy light through the transparent carrier plate to separate the substrate body from the transparent carrier plate. The step 540 is also called the releasing process. In the preferred embodiment of the present invention, the high-energy light may be laser such as UV laser. Please refer to both FIGS. 6(e) and 7; high-energy light E may be emitted from one side of the transparent carrier plate 400 that is opposite to the substrate body 100 and through the transparent carrier plate 400. Energy of the high-energy light is sufficient to pass through the transparent carrier plate 400, wherein the high-energy light preferably arrives at the interface of the transparent carrier plate and the substrate body 100.

Further speaking, the high-energy light E may penetrate at least a portion of the transparent carrier plate 400, wherein a portion of the substrate body 100 supported by the portion of the transparent carrier plate 400 has the signal circuit area 300 on the opposite supporting surface 150. Accordingly, the high-energy light E may penetrate the transparent carrier plate 400 and arrive at a portion of the bottom surface 160, wherein the portion of the bottom surface 160 corresponds to the signal circuit area 300 of the supporting surface 150 on opposite side. The high-energy light E may decompose or damage the bottom surface 160 by which the substrate body 100 is attached to the transparent carrier plate 400 and release the attachment of the substrate body 100 and the transparent carrier plate 400, which results in separation of the substrate body 100 and the transparent carrier plate 400. The process is usually accompanied by generation of heat and gas P. In addition, the high energy may also result in notches due to a scanning path.

The gas P may come from the decomposition and/or vaporization of the substrate body 10, wherein the molecules of gas P may be the molecules of carbon group. The gas P first appears between the substrate body 100 and the transparent carrier plate 400 and is able to escape and leave away from a space A between the substrate body 100 and the transparent carrier plate 400. Accordingly, it is not easy for the substrate body 100, especially the portion of the substrate body 100 having the signal circuit area 300 to deform due to synergy effect resulted from the gas P and gas in the small space A. Specifically, the deformation may be an expansion of the substrate body 100 resulted from pressure and heat coming from the direction of the transparent carrier plate 400.

On the other hand, when the sacrificial layer is disposed between the substrate and the transparent carrier plate, the high-energy light E may be emitted from a side of the transparent carrier plate 400 opposite to the sacrificial layer 500. The energy of the high-energy light is sufficient to pass through the transparent carrier plate 400, wherein the high-energy light preferably arrives at an interface of the transparent carrier plate 400 and the sacrificial layer 500. The high energy light E may decompose or damage the sacrificial layer 500 to release the attachment of the substrate body 100 and the transparent carrier plate 400 and separate the substrate body 100 and the transparent carrier plate 400 from each other. In addition, loss of the substrate body 100 in the releasing process is therefore reduced by the deposition of the sacrificial layer 500.

In comparison to variation of the pitch between the pads of the conventional signal circuit area due to deformed substrate body, the apertures 360 of the substrate body 100 can reduce the variation. Because of the releasing process of the present invention, improvement in the substrate body 100 and the element thereon further improves the subsequent processes and therefore increase the yield of the display module substrate.

On the other hand, in the preferred embodiment of the present invention, the high-energy light E may be emitted into the transparent carrier plate 400 in the extension direction of the signal circuit area 300 (i.e. the longer side) that accordingly separates a portion of the substrate body 100 along the extension direction from the transparent carrier plate 400. In addition, the laser may substantially scan the plate in accordance with the width direction of the signal circuit area 300. Following the laser's moving, as shown in FIG. 7, portions of the substrate body 100 in the width direction of the signal circuit area 300 substantially separate from the transparent carrier plate.

As shown in FIG. 4, the notches S resulted from the etching of the bottom surface 160 by the high-energy light surround the apertures 360, wherein a portion of the bottom surface 160 having the notches S reflects where the high-energy light E acts on. That is, the high-energy light acts in the vicinity of the apertures 360 and a portion of the substrate body around the apertures 360; accordingly, molecules of gas P resulted from vaporization of the portion of the substrate body 10 may escape through the apertures 360.

As shown in FIG. 6(f), after the step 540, the substrate body 100 is easily separated from the transparent carrier plate 400 to accomplish the manufacture of the display module substrate 10. Alternatively, after the step 540, a driving circuit can be disposed on the substrate body 100/display module substrate 10.

Although the preferred embodiments of present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. A manufacturing method of a display module substrate, including:

(a) disposing a substrate body on a transparent carrier plate, wherein the substrate body has a bottom surface and a supporting surface opposite to the bottom surface, the bottom surface is attached to the transparent carrier plate, the supporting surface includes a viewing area and a signal circuit area;

(b) disposing a plurality of signal circuits in the signal circuit area;

(c) forming a plurality of apertures in the signal circuit area, wherein the apertures penetrate through the substrate body, and at least a portion of the apertures are located between the adjacent signal circuits and distributed along an extension direction of the signal circuits;

(d) etching the bottom surface by high-energy light through the transparent carrier plate to separate the substrate body from the transparent carrier plate.

2. The manufacturing method of claim 1, further including:

(e) disposing a driving circuit in the signal circuit area after separating the substrate body from the transparent carrier plate.

3. The manufacturing method of claim 1, further comprising disposing a sacrificial layer on the transparent carrier plate and disposing the substrate body on the sacrificial layer.

4. The manufacturing method of claim 1, wherein the step (b) further includes arranging the signal circuits in a fan-like shape, so the apertures located between the signal circuits are also arranged in a fan-like shape.

5. The manufacturing method of claim 1, wherein the step (d) further includes forming notches on the bottom surface.

6. The manufacturing method of claim 1, wherein the step (c) includes forming the apertures to have a diameter not less than 1 μm.

7. The manufacturing method of claim 1, wherein the step (c) includes forming the apertures to have a distance between the adjacent apertures not less than 1 μm.

* * * * *